United States Patent
Chang et al.

(10) Patent No.: US 6,765,514 B2
(45) Date of Patent: Jul. 20, 2004

(54) METHOD AND APPARATUS FOR PROVIDING FAST DATA RECOVERY WITH ADAPTIVE PULSE CODE MODULATION CODING

(75) Inventors: Hsien-Ming Chang, Hsinchu (TW); Chung-Liang Yen, Hsinchu (TW)

(73) Assignee: Avid Electronics Corp., Hsinchu (TW)

( * ) Notice: Subject to any disclaimer, the term of this patent is extended or adjusted under 35 U.S.C. 154(b) by 0 days.

(21) Appl. No.: 10/316,801

(22) Filed: Dec. 11, 2002

(65) Prior Publication Data

US 2004/0066319 A1 Apr. 8, 2004

(30) Foreign Application Priority Data

Oct. 4, 2002 (TW) ........................................ 91122950 A

(51) Int. Cl.⁷ ............................................... H03M 7/30
(52) U.S. Cl. ............................ 341/76; 341/50; 341/51; 704/217
(58) Field of Search ................. 341/76, 143, 50, 341/51; 375/240.23, 245, 244, 354; 365/45; 382/165; 700/280

(56) References Cited

U.S. PATENT DOCUMENTS

| | | | | |
|---|---|---|---|---|
| 4,654,863 A | * | 3/1987 | Belfield et al. ............ 375/245 |
| 4,785,349 A | * | 11/1988 | Keith et al. ............ 375/240.23 |
| 5,319,573 A | * | 6/1994 | Corleto et al. ............ 700/280 |
| 5,386,436 A | * | 1/1995 | Kawada et al. ............ 375/354 |
| 5,689,453 A | * | 11/1997 | Tsukagoshi .................. 365/45 |
| 5,937,086 A | * | 8/1999 | Taguchi ...................... 382/165 |
| 5,973,629 A | * | 10/1999 | Fujii ............................ 341/76 |
| 5,978,757 A | * | 11/1999 | Newton ...................... 704/217 |
| 6,078,620 A | * | 6/2000 | Rennig ........................ 375/244 |

* cited by examiner

Primary Examiner—Jean Bruner Jeanglaude
(74) Attorney, Agent, or Firm—Jackon Walker LLP

(57) ABSTRACT

A method and apparatus for providing fast data recovery with adaptive pulse code modulation (ADPCM) coding wherein, an ADPCM encoder periodically records the compressional parameters in memory together with regular compressed codes, and an ADPCM decoder retrieves the previously saved compressional parameters when reading the regular data from memory. In case any error occurs in the data compression and decompression processes which would cause a data divergence in the output of the ADPCM decoder, the previously saved compressional parameters can be used to correct the output data, thus enabling fast data recovery in the data outputting process without affecting downstream data in the data stream.

4 Claims, 4 Drawing Sheets

METHOD AND APPARATUS FOR PROVIDING FAST DATA RECOVERY WITH ADAPTIVE PULSE CODE MODULATION CODING

BACKGROUND OF THE INVENTION

1. Field of the Invention

The present invention relates to a method and apparatus for providing fast data recovery with adaptive pulse code modulation (ADPCM) coding, in particular to a coding technique that can reduce the error rate in the data compression process by simultaneously correcting errors during data output from memory.

2. Description of Related Arts

Currently, pulse code modulation (PCM) is still one of the most commonly used coding techniques, which may be further differentiated between those employing the frequency domain and the time domain in the pulse compression. For ADPCM coding based on the time domain, as shown in FIG. 3, the basic architecture includes an ADPCM encoder (70) and an ADPCM decoder (90) respectively installed on the input and output terminals of a memory device (80). The basic components in an ADPCM encoder (70), as shown in FIG. 4, includes a quantizer (71), a dequantizer (72), a predictor (73), and an adaptive delta tuner (74). As for the architecture of the ADPCM decoder (90), its components include a dequantizer (72), a predictor (73) and an adder (91), as shown in FIG. 5. The decoder (90) is installed in the encoder (70) for authenticating the correctness of data output.

Input data (Di) are processed by the ADPCM encoder (70) in the compression process, and then saved in the memory device (80); conversely, in the decompression process, data are read from the memory device (80) through the ADPCM decoder (90) before outputting to an I/O device.

In actual operation, the predictor (73) first generates an estimated size of the next datum (Px), which is then subtracted from the input signal (Di) by a subtractor (92), generating a variance (Perr). The variance (Perr) should be a micro value in the ideal situation, which is then quantized by the quantizer (71), by step sizing the variable portion, while the fixed portion remains unchanged, so as to generate an output code, given a certain level of resolution. The adaptive delta tuner (74) outputs a delta value and passes it to the quantizer (71) and the dequantizer (72).

When the dequantizer (72) receives the compressed code, it uses the same delta value provided by the adaptive delta tuner (74) under a given resolution, to generate a Qperr signal, which is then added to the prediction value (Px) from the predictor (80) through the service of the adder (91), generating a signal value (Qx) which will be sent back to the input of the predictor (80). The above processes of data value subtraction, variance quantization, and dequantization are to be repeated until the memory operation is completed.

The basic architecture of the ADPCM encoder and decoder as well as the operation theory of the ADPCM coding has been explained above. It is apparent that the quality of output from the adaptive delta tuner (74) and the predictor (73) determines the result of data compression. When an error occurs during data read from the memory device (80), the output value of the ADPCM decoder (90) is altered. For example, in the case of an audio CD, divergence in the decoded data will cause irritating tune burst. Since the ADPCM encoding technique has to rely on changes in two adjacent sampled data to generate a signal output, when an error occurs in the preceding data, a chain reaction will corrupt all subsequent data in the data stream. That is the reason that a tune burst often lasts for a prolonged period until a whole block of data has been processed, or it could be even worse, failing to return to the normal condition altogether.

The present invention is to address these problems in the conventional ADPCM coding technique.

SUMMARY OF THE INVENTION

The main object of the present invention is to provide a data coding technique that can correct any error and restore to the original data quickly in the data decoding process by simultaneously correcting data errors during data output from memory.

The data coding technique in accordance with the present invention comprises the steps of:

- periodically recording the compressional parameters in the process of writing data to the memory; and
- simultaneously retrieving the compressional parameters in the process of reading data from the memory.

When any error occurs in data output, that is data divergence appears on the output of the ADPCM decoder, a data recovery mechanism is invoked by using the compressional parameters accompanying the data read from memory to force the decoder to reproduce the same decompression conditions, thus the output data can be restored to the original value in a relatively short time without affecting succeeding data streams.

The compressional parameters in accordance with the invention refer to the delta value and the resultant data size value (Qx) from the operations of quantization and dequantization.

The second object of the present invention is to provide an effective coding technique that can reduce the error rate in data compression when writing data to memory.

The coding technique in accordance with the invention can further incorporate Gray Codes in the data encoding process in between the ADPCM encoder and the memory device, and for the same reason the data read from memory have to be stripped of Gray Codes first before passing to the ADPCM decoder for data decoding.

Gray Code is a positional binary number expression in which any two adjacent data values having a difference are represented by changes in one data bit, thus effectively reducing the output signal frequency in data transmission, and the chance of creating errors during data write to memory.

The features and structure of the present invention will be more clearly understood when taken in conjunction with the accompanying figures.

DETAILED DESCRIPTION OF THE PREFERRED EMBODIMENT

Figure 1:
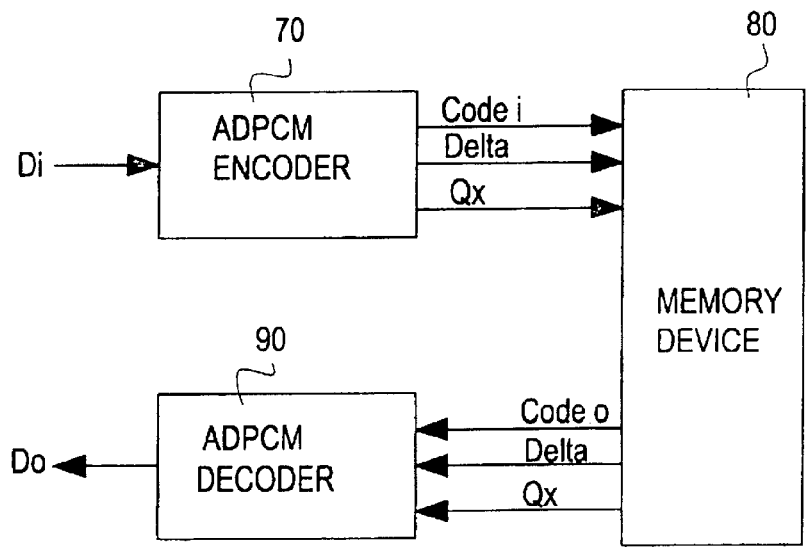
FIG. 1 is a block diagram of the architecture of the encoder and decoder employed in the first embodiment of the present invention.

With reference to FIG. 1, the architecture of the first embodiment of the present invention includes a memory device (80), an ADPCM encoder (70) and an ADPCM decoder (90) which are respectively connected to the input and output of the memory device (80), wherein the ADPCM encoder (70) encodes the input data before data write to the memory device (80), and the ADPCM decoder (90) then decodes the data read from the memory device (80).

Figure 4:
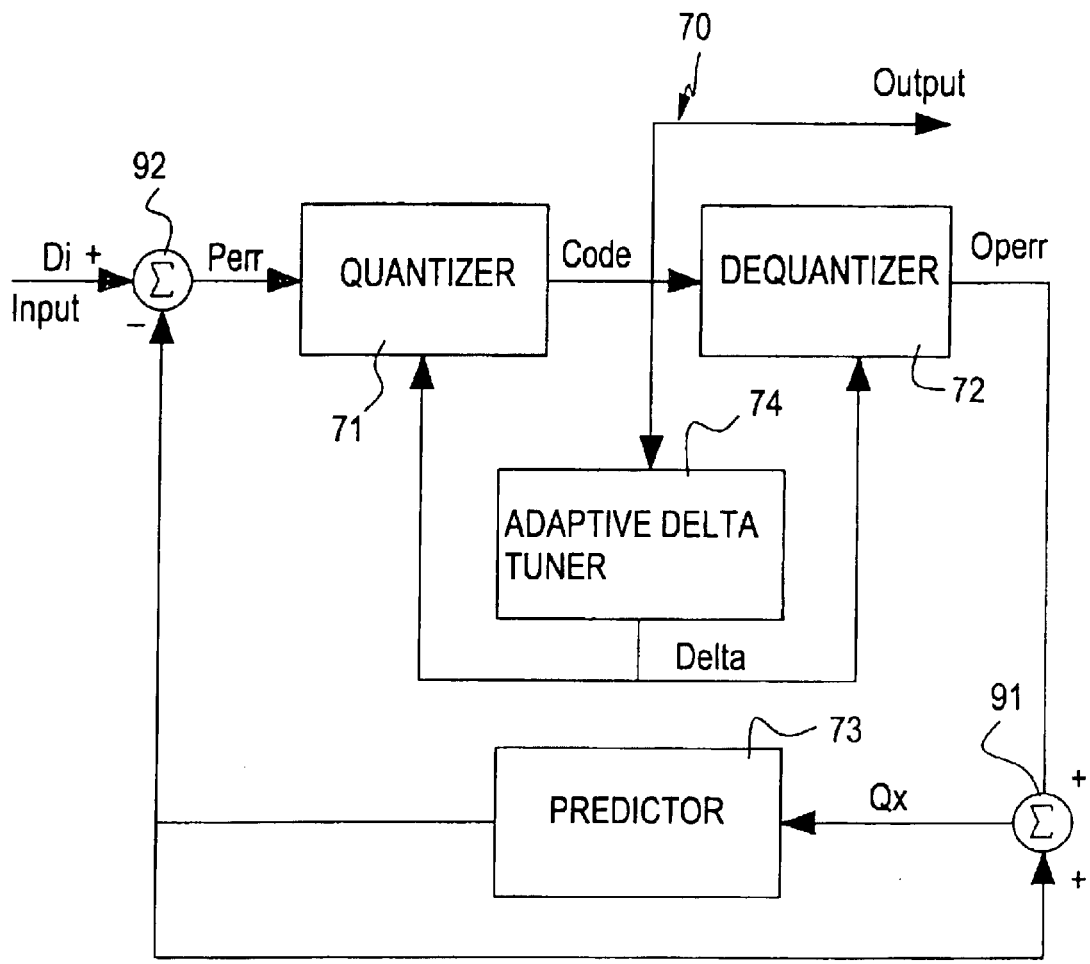
FIG. 4 is a block diagram of a conventional ADPCM encoder.
Figure 5:
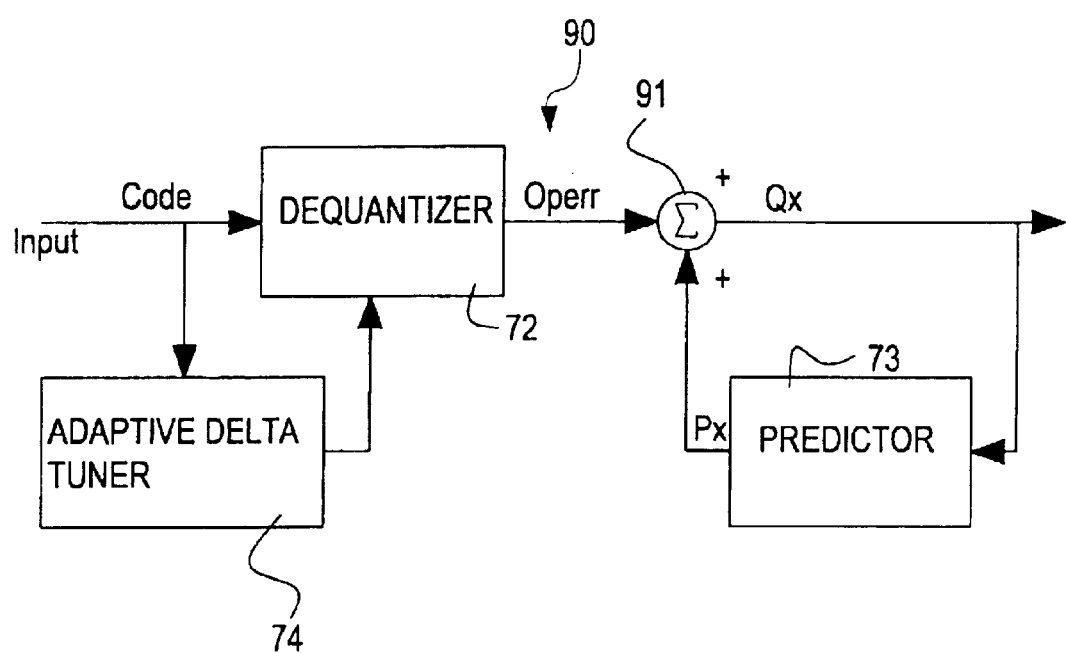
FIG. 5 is a block diagram of a conventional ADPCM decoder.

The basic components in the ADPCM encoder (70), as shown in FIG. 4, include a quantizer (71), a dequantizer (72), a predictor (73), and an adaptive delta tuner (74). As for the ADPCM decoder (90), as shown in FIG. 5, its components include a dequantizer (72), a predictor (73) and an adder (91).

One of the main tasks of the APCM encoder in accordance with the invention is to record the compressional parameters periodically during continuous data write to the memory device (80) in the data compression process. The time interval between successive recordings of the compressional parameters in memory is to be determined beforehand so that an optimal result can be produced in the operation. The term 'compressional parameters' refers to the delta value and the resultant data size value (Qx) from the operations of quantization and dequantization.

The process of generating the delta value and the input signal (Qx) for the predictor (73) is diagrammatically shown in FIG. 4. The ADPCM encoder (70) first estimates the size of the next data (Px) through the service of the predictor (73). The prediction value (Px) is then subtracted by the input code value (Di) to generate a variance (Perr) representing the difference value between the input code value (Di) and the prediction value (Px). A delta value is generated by the adaptive delta tuner (74) which is then used by the quantizer (71) in the quantization provided with a given resolution. After the quantization of the variance, a compressed code is generated for data write to the memory device (80).

Conversely, when the dequantizer (72) receives the compressed code from data read, it first undergoes dequantization using the same delta value provided by the adaptive delta tuner (74) and a given resolution. The dequantizer (72) generates an Qperr value, which is then added to the prediction value (Px) by the adder (91) to generate a Qx value which is then sent back to the input of the predictor (73).

From the foregoing, the computation of the delta value and the resultant Qx value from the operation of variance (Qperr) and the prediction value (Px) significantly determines the accuracy of compressed code and the authentication results. These values constitute the compressional parameters that are to be recorded in the memory device (80) along with the regular compressed data. When the data are read out from the memory device (80), the ADPCM decoder (90) is to decode the compressed data and authenticates the data values using the compressional parameters. If any error exists in the compressed data, the original data will be discovered and recovered in the decompression process, and such errors will not be propagated downstream to other data in the data stream. The data recovery time is determined by the timing of the write cycle assigned for recording the compressional parameters in the memory device (80).

The compressional parameters are saved in the unused portion of a memory device (80), which normally occupies 0.5% of the total unused memory space in a memory device (80). In actual operation, compressional parameters usually occupy 0.2% of the total memory space. In order to save memory space, the compressional parameters are only saved periodically with an appropriate time interval.

In one embodiment of the invention, the compressional parameters are saved once for 8192 times of data write operation, that means the time interval, between two successive recordings of compressional parameters, is equivalent to 0.016 seconds approximately. Every time an error occurs, the system should be able to recover the normal data in less than 0.016 seconds, thus realizing effective reduction in the error rate and data divergence time.

Figure 2:
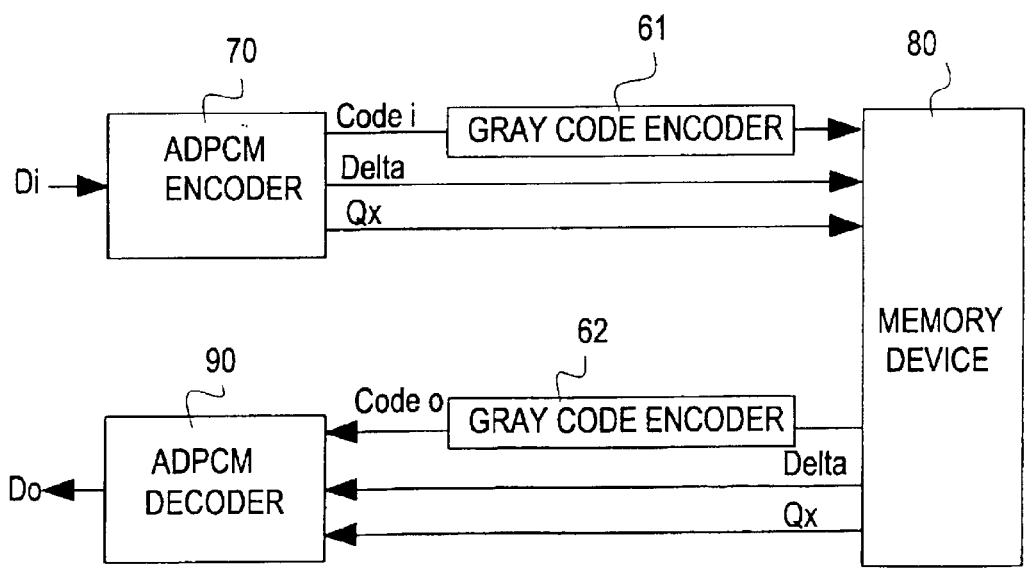
FIG. 2 is a block diagram of the architecture in the second embodiment of the invention incorporating Gray Code.
Figure 3:
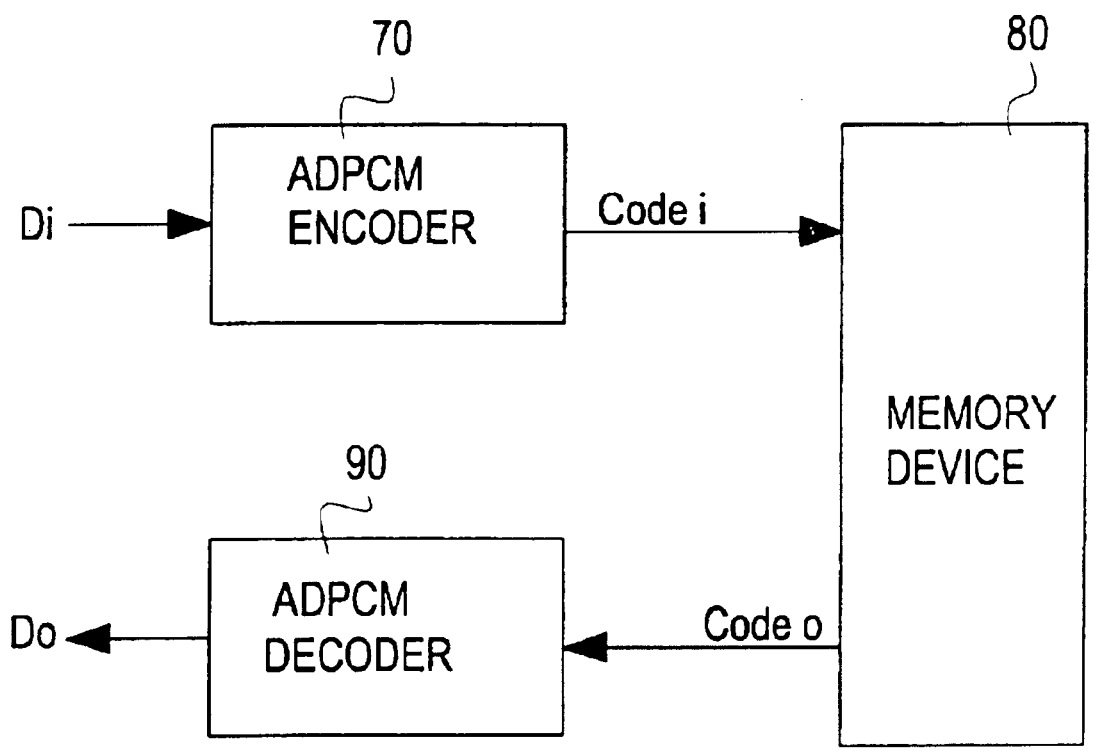
FIG. 3 is the basic architecture of conventional ADPCM encoder/decoder.

The architecture of the second embodiment of the invention, as shown in FIG. 2, is basically similar to that in the first embodiment except the addition of a Gray Code processor. The system comprises a memory device (80), an ADPCM encoder (70), an ADPCM decoder (90), a Gray Code encoder (61) and a Gray Code decoder (62).

Just like the operation of the first embodiment, the ADPCM encoder (70) periodically records the compressional parameters and saves them in the memory device (80) together with the regular compressed data. When these data are read out from the memory device (80), the compressional parameters and the regular data are both retrieved by the ADPCM decoder (90) for decoding and authentication.

In addition to the compressional parameters, the Gray Code encoder (61) is introduced in the second embodiment, which is installed between the ADPCM encoder (70) and the memory device (80). Data to be sent from the ADPCM encoder (70) to the memory device (80) are processed by the Gray Code encoder (61) before writing to the memory device (80), and conversely, data to be read from the memory device (80) to the ADPCM decoder (90) are processed by the Gray Code decoder (62) for decoding and removing the Gray codes.

Choosing Gray Code as an additional data safety measure is because Gray Code is a positional binary expression formed by mutual exclusion, not a weighted coding. For any random codes in adjacent arrangement, only one data bit is changed at a time, thus signal variation in pulse code modulation can be reduced in the data transmission process, and the error rate can be significantly reduced.

The foregoing description of the preferred embodiments of the present invention is intended to be illustrative only and, under no circumstances, should the scope of the present invention be so restricted.

What is claimed is:

1. A method for providing fast data recovery with adaptive pulse code modulation (ADPCM) coding, comprising the steps of:
    periodically recording of compressional parameters and saving them in memory together with regular data; and
    simultaneously retrieving of compressional parameters in a process of reading data from memory;
    whereby the compressional parameters are used for authentication of decoded data and restoration of data value in a data outputting process, so that any error from compressed codes can be recovered in a short time.

2. The method for providing fast data recovery with adaptive pulse code modulation (ADPCM) coding as claimed in claim 1, wherein the compressional parameters include a delta value and a resultant value (Qx) from operations in variance quantization and dequantization.

3. The method for providing fast data recovery with adaptive pulse code modulation (ADPCM) coding as claimed in claim 1, wherein the data to be written to memory are added with Gray Code in their path from a ADPCM encoder to the memory device; conversely, data read to be read from memory are stripped of Gray Code in their path from the memory device to the ADPCM for data decoding.

4. An apparatus for providing fast data recovery with adaptive pulse code modulation (ADPCM) coding, comprising:

a memory device for saving regular compressed codes and compressional parameters to be used in a data decompression process;

an ADPCM encoder for writing data to memory in the form of compressed codes together with the compressional parameters; and a Gray Code encoder installed between the output of the ADPCM encoder and the memory device;

an ADPCM decoder for retrieving the compressional parameters and decoding the compressed codes to output the original data, and a Gray Code decoder installed between the memory device and the input of the ADPCM decoder.

* * * * *